(12) United States Patent
Zhang et al.

(10) Patent No.: US 12,477,672 B2
(45) Date of Patent: Nov. 18, 2025

(54) SUPPORT ASSEMBLY, DISPLAY MODULE, AND ELECTRONIC DEVICE

(71) Applicant: Honor Device Co., Ltd., Shenzhen (CN)

(72) Inventors: Yujun Zhang, Shenzhen (CN); Ning Guo, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 0 days.

(21) Appl. No.: 18/271,469

(22) PCT Filed: Aug. 30, 2022

(86) PCT No.: PCT/CN2022/115824
§ 371 (c)(1),
(2) Date: Jul. 10, 2023

(87) PCT Pub. No.: WO2023/030313
PCT Pub. Date: Mar. 9, 2023

(65) Prior Publication Data
US 2024/0057270 A1 Feb. 15, 2024

(30) Foreign Application Priority Data
Sep. 2, 2021 (CN) .......................... 202111026467.X

(51) Int. Cl.
*H10K 30/80* (2023.01)
*H05K 5/02* (2006.01)
*H10K 102/00* (2023.01)

(52) U.S. Cl.
CPC ........... *H05K 5/0217* (2013.01); *H10K 30/80* (2023.02); *H10K 2102/311* (2023.02)

(58) Field of Classification Search
CPC .............................. G09G 9/301; H10K 77/111
See application file for complete search history.

(56) References Cited

U.S. PATENT DOCUMENTS

| 9,947,882 B2 | 4/2018 | Zhang et al. |
| 11,546,986 B2 * | 1/2023 | Wang ...................... H05K 1/028 |

(Continued)

FOREIGN PATENT DOCUMENTS

| CN | 110189638 A | 8/2019 |
| CN | 210955911 U | 7/2020 |

(Continued)

*Primary Examiner* — Kevin M Nguyen
(74) *Attorney, Agent, or Firm* — Leydig, Voit & Mayer, Ltd.

(57) ABSTRACT

A support assembly includes a support plate, a first adhesive layer, a substrate, and a second adhesive layer. The support plate, the first adhesive layer, the substrate, and the second adhesive layer are stacked from the bottom up. The substrate is attached to the support plate by using the first adhesive layer, and the support assembly is configured to attach to another structure by using the second adhesive layer, thereby forming a display module of a foldable-screen device. The support assembly includes a bendable region; the support assembly is configured to bend in the bendable region; the support assembly is provided with a plurality of first holes in the bendable region; and the plurality of first holes penetrate through at least the support plate and the substrate in a stacking direction of the support plate, the first adhesive layer, the substrate, and the second adhesive layer.

16 Claims, 6 Drawing Sheets

(56) References Cited

U.S. PATENT DOCUMENTS

| | | |
|---|---|---|
| 2018/0192527 A1* | 7/2018 | Yun ..................... G06F 1/1681 |
| 2020/0257338 A1* | 8/2020 | Park ........................ G02B 1/14 |
| 2021/0168929 A1 | 6/2021 | Wang et al. |
| 2021/0265590 A1* | 8/2021 | Wang ................ H10K 59/8722 |
| 2022/0164045 A1* | 5/2022 | Kishimoto ............ C09J 183/04 |
| 2023/0176621 A1 | 6/2023 | Zhou et al. |

FOREIGN PATENT DOCUMENTS

| | | |
|---|---|---|
| CN | 111524902 A | 8/2020 |
| CN | 111862824 A | 10/2020 |
| CN | 112991953 A | 6/2021 |
| CN | 113112914 A | 7/2021 |
| CN | 113257123 A | 8/2021 |
| CN | 113724631 A | 11/2021 |
| WO | 2015178391 A1 | 11/2015 |
| WO | 2017052732 A1 | 3/2017 |

* cited by examiner

SUPPORT ASSEMBLY, DISPLAY MODULE, AND ELECTRONIC DEVICE

CROSS-REFERENCE TO RELATED APPLICATIONS

This application is a national stage of International Application No. PCT/CN2022/115824, filed on Aug. 30, 2022, which claims priority to Chinese Patent Application No. 202111026467.X, filed on Sep. 2, 2021. The disclosures of both of the aforementioned applications are hereby incorporated by reference in their entireties.

TECHNICAL FIELD

This application relates to the field of display screen technologies, and in particular, to a support assembly, a display module, and an electronic device.

BACKGROUND

In recent years, display screen technologies for electronic devices have developed rapidly, especially a bendable flexible screen has emerged, so that more product forms can be developed for the electronic devices, and a foldable-screen device is a currently emerging product form. At present, a display module of a foldable-screen device has a multi-layer stacked structure. The multi-layer stacked structure may include a support plate, a substrate, a display panel, and at least one protection layer sequentially from the bottom up. The support plate, the substrate, the display panel, and the at least one protection layer are attached together by using adhesive layers (for example, optically clear adhesives (OCAs) and pressure-sensitive adhesives (PSAs)).

The display module includes at least one bendable region. The display module is configured to bend in the bendable region, thereby unfolding and folding a device body of the foldable-screen device. During bending of the display module, structures on layers of the display module generate internal stresses due to deformation and interaction. Under the action of the internal stresses, an originally attached state among the structures on the layers of the display module may be destroyed, resulting in structural peeling between some layers. As a result, the display module is imprinted or damaged.

SUMMARY

Embodiments of this application provide a support assembly, a display module, and an electronic device, to reduce an internal stress generated during bending of a display module of a foldable-screen device, thereby avoiding a peeling phenomenon, and improving reliability of the display module.

According to a first aspect, an embodiment of this application provides a support assembly, including: a support plate, a first adhesive layer, a substrate, and a second adhesive layer, where the support plate, the first adhesive layer, the substrate, and the second adhesive layer are stacked from the bottom up; the substrate is attached to the support plate by using the first adhesive layer, and the support assembly is configured to attach to another structure by using the second adhesive layer, thereby forming a display module of a foldable-screen device; the support assembly includes a bendable region; the support assembly is configured to bend in the bendable region; the support assembly is provided with a plurality of first holes in the bendable region; the plurality of first holes are distributed at intervals in an array; and the plurality of first holes penetrate through at least the support plate and the substrate in a stacking direction of the support plate, the first adhesive layer, the substrate, and the second adhesive layer.

According to the support assembly provided in this embodiment of this application, due to disposing of the first holes, at least the support plate and the substrate are hollowed out. This reduces an internal stress generated during bending of the support assembly and an internal stress exerted by the support assembly on another structure of the display module. Therefore, a status of attaching between structures on layers of the display module is prevented from being damaged by the internal stress; no peeling phenomenon occurs after the display module is bent; and reliability of the display module is improved.

In an implementation, the plurality of first holes penetrate through the support plate, the first adhesive layer, the substrate, and the second adhesive layer in the stacking direction. In this way, the first holes penetrate through the entire support assembly in the stacking direction, thereby effectively reducing internal stresses generated during bending of the support plate, the first adhesive layer, the substrate, and the second adhesive layer.

In an implementation, the plurality of first holes are formed in the support plate and the substrate, and penetrate through the support plate and the substrate in the stacking direction. In this way, the first holes penetrate through only the support plate and the substrate in the stacking direction, but the first adhesive layer and the second adhesive layer still have complete structures. Because no hole needs to be formed in the first adhesive layer and the second adhesive layer, convenience is brought for reducing an internal stress of the support assembly, and processing difficulty of the support assembly is lowered.

In an implementation, the first hole is a strip-shaped hole, and a length direction of the first hole is parallel to an axis of the bendable region of the support assembly; and the plurality of first holes are distributed at intervals in the array in directions parallel to the axis and directions perpendicular to the axis. Due to the strip-shaped holes, a larger hollowed-out area can be formed on the support assembly, thereby providing a larger deformation space for materials such as the support plate and the substrate, improving bending performance of the materials such as the support plate and the substrate, and reducing the internal stress generated during bending.

In an implementation, the support assembly is further provided with a plurality of second holes in the bendable region, and the plurality of second holes are distributed at intervals in an array; and the plurality of second holes are formed in a plate surface, back to the first adhesive layer, of the support plate, and form a specific depth H in the stacking direction, where the depth H is less than a thickness B of the support plate in the stacking direction. In this way, the second holes can be formed by performing hollowing out on the support plate in a region without the first holes, thereby improving bending performance of the support plate in the region without the first holes, and reducing the internal stress generated during bending.

In an implementation, the second hole is a strip-shaped hole, and a length direction of the second hole is parallel to the axis; the second hole continuously extends in a direction parallel to the axis from an end surface on one side of the support plate to an end surface on the other side of the support plate; and the plurality of second holes are distributed at intervals in the array in a direction perpendicular to the axis. Due to the strip-shaped holes, a larger hollowed-out area can be formed on the support plate, thereby providing a larger deformation space for the support plate, improving bending performance of the support plate, and reducing the internal stress generated during bending.

In an implementation, the bendable region includes an internally bendable region, the support assembly is configured to bend in the internally bendable region towards the second adhesive layer, and the plurality of first holes are formed in the internally bendable region.

In an implementation, the bendable region includes an externally bendable region, the support assembly is configured to bend in the externally bendable region towards the support plate, and the plurality of second holes are formed in the externally bendable region.

In an implementation, both the first adhesive layer and the second adhesive layer are pressure-sensitive adhesives.

According to a second aspect, an embodiment of this application provides a display module. The display module includes: the support assembly according to the first aspect of the embodiments of this application and each implementation of the first aspect, a display panel, a third adhesive layer, a first protection layer, a fourth adhesive layer, and a second protection layer, where the support assembly, the display panel, the third adhesive layer, the first protection layer, the fourth adhesive layer, and the second protection layer are stacked from the bottom up; and the display panel is attached to the substrate of the support assembly by using the second adhesive layer, the first protection layer is attached to the display panel by using the third adhesive layer, and the second protection layer is attached to the first protection layer by using the fourth adhesive layer.

The display module in this embodiment of this application has a smaller stress during bending. Therefore, a status of attaching between structures on layers of the display module is prevented from being damaged by the internal stress; no peeling phenomenon occurs after the display module is bent; and reliability of the display module is improved.

In an implementation, the display panel is an organic light-emitting diode OLED display panel.

In an implementation, both the third adhesive layer and the fourth adhesive layer are optically clear adhesives.

In an implementation, the first protection layer is a polarizing layer, and the second protection layer is ultra-thin glass or a clear polyimide film.

According to a third aspect, an embodiment of this application provides an electronic device. The electronic device includes one or more display modules, where at least one of the display modules is the display module according to the second aspect of the embodiments of this application and each implementation of the second aspect.

REFERENCE NUMERALS

10: device body; 11: display screen; 21: support plate; 22: display panel; 23: cover plate; 31: bendable region; 32: plane region; 41: internally bendable region; 42: externally bendable region; 51: support plate; 52: substrate; 53: display panel; 54: first protection layer; 55: second protection layer; 56: pressure-sensitive adhesive; 57: pressure-sensitive adhesive; 58: optically clear adhesive; 59: optically clear adhesive; 100: support plate; 200: first adhesive layer; 300: substrate; 400: second adhesive layer; 510: first hole; 520: second hole; 610: display panel; 620: third adhesive layer; 630: first protection layer; 640: fourth adhesive layer; and 650: second protection layer.

DESCRIPTION OF EMBODIMENTS

In recent years, display screen technologies for electronic devices have developed rapidly, especially a bendable flexible screen has emerged, so that more product forms can be developed for the electronic devices, and a foldable-screen device is a currently emerging product form.

Figure 1:
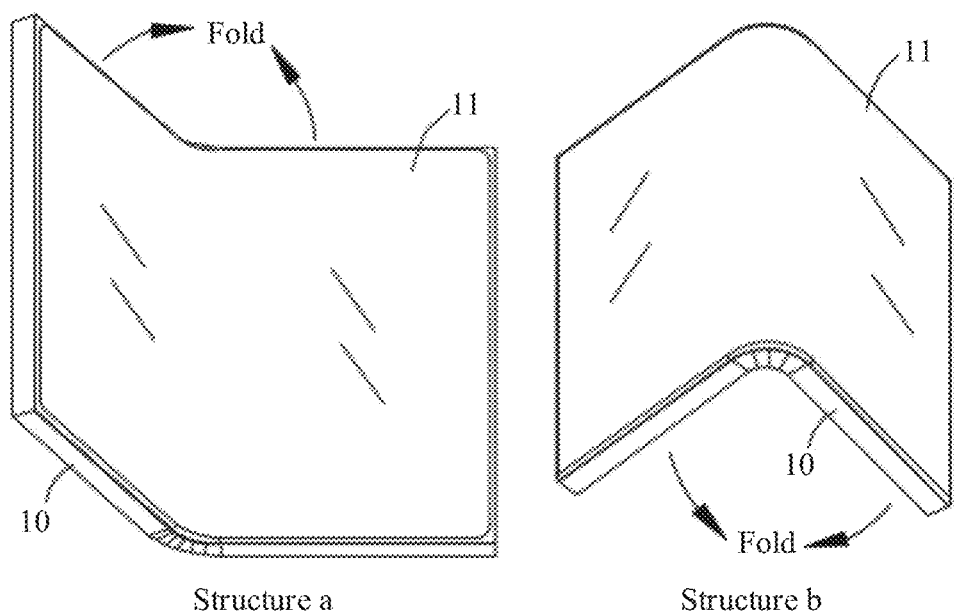
FIG. 1 is a schematic diagram of a structure of a foldable-screen device according to an embodiment of this application.

At present, foldable-screen devices may be classified into internally foldable-screen devices and externally foldable-screen devices based on different folding directions of display modules. FIG. 1 is a schematic diagram of a structure of a foldable-screen device according to an embodiment of this application. The structure a in FIG. 1 is a schematic diagram of a structure of an internally foldable-screen device. The structure b in FIG. 1 is a schematic diagram of a structure of an externally foldable-screen device. As shown in the structure a in FIG. 1, the internally foldable-screen device is an electronic device whose device body 10 can be bent towards a side having a display module 11. The display module 11 is hidden on an inner side of the device body 10 of the electronic device after the device body 10 of the electronic device is folded. Therefore, the following effect is achieved: The display module 11 is hidden when the device body 10 is in a folded state, and is displayed when the device body 10 is in an unfolded state. As shown in the structure b in FIG. 1, the externally foldable-screen device is an electronic device whose device body 10 can be bent towards a back side of the device body 10. The display module 11 surrounds an outer side of the device body 10 of the electronic device after the device body 10 of the electronic device is folded. Therefore, the following effect is achieved: The display module 11 surrounds the device body 10 to form a surrounding screen when the device body 10 is in a folded state, and forms a normally straight screen when the device body 10 is in an unfolded state.

Figure 2:
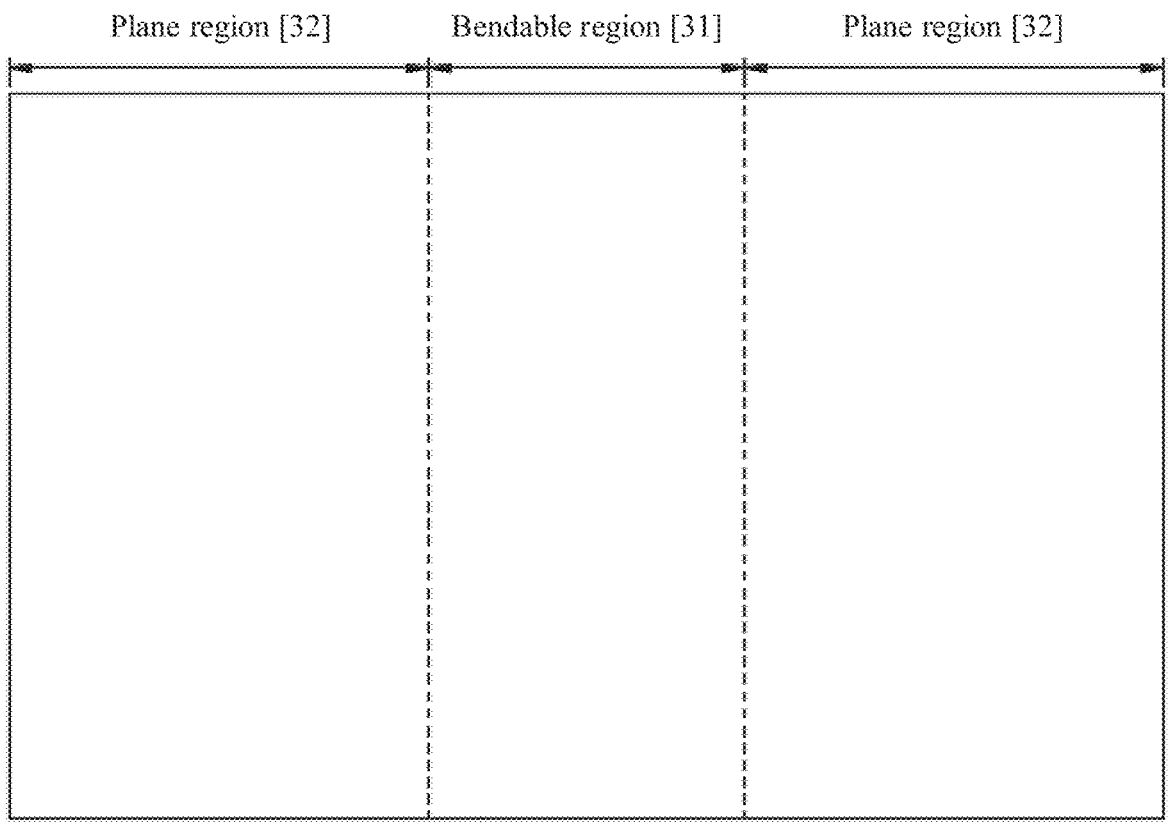
FIG. 2 is a schematic diagram of an unfolded display module according to an embodiment of this application.
Figure 3:
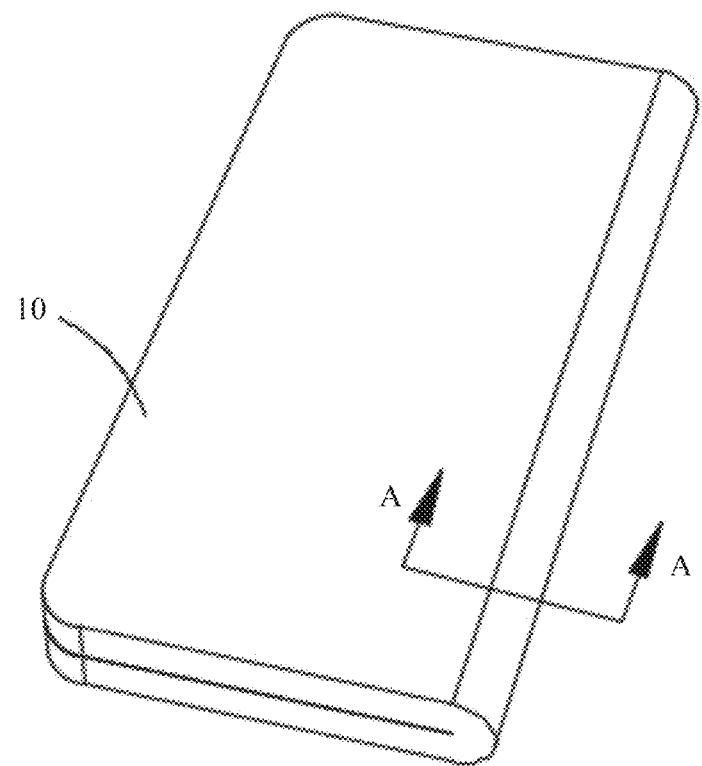
FIG. 3 is a schematic diagram of a form of a display module of a foldable-screen device whose device body is in a folded state according to an embodiment of this application.
Figure 3:
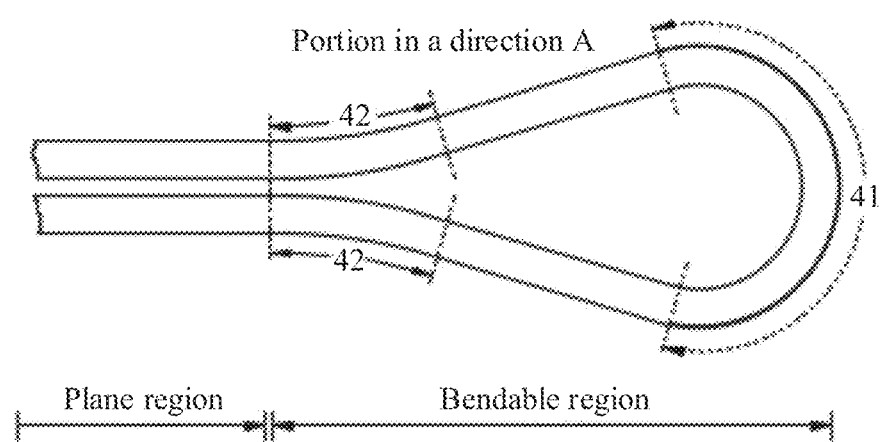

FIG. 2 is a schematic diagram of an unfolded display module according to an embodiment of this application. As shown in FIG. 3, the display module may include at least one bendable region 31. A region other than the bendable region 31 is a plane region 32. The bendable region 31 is a region in which the display module can be bent during bending of a device body of a foldable-screen device. The plane region 32 is a region in which the display module cannot be bent during bending of the device body of the foldable-screen device. A quantity of bendable regions 31 depends on a quantity of folds of the device body of the foldable-screen device. If the device body of the foldable-screen device is bent only once (namely, a single-foldable-screen device), the display module may include one bendable region 31. If the device body of the foldable-screen device is bent twice (namely, a dual-foldable-screen device), the display module may include two bendable regions 31. As an example, the display module shown in FIG. 2 includes one bendable region 31. The plane regions 32 are disposed on the left and right sides of the bendable region 31, so that the device body of the foldable-screen device can be bent leftwards or rightwards. The quantity of bendable regions 31 of the display module does not fall within a discussion scope of embodiments of this application, and thus is not further described below.

FIG. 3 uses an internally foldable-screen device as an example, and is a schematic diagram of a form of a display module of a foldable-screen device whose device body 10 is in a folded state. As shown in FIG. 3, when the device body 10 is in the folded state, an internally bendable region 41 and externally bendable regions 42 may be formed at different locations of the bendable region. The internally bendable region 41 is a region in which the display module is bent towards an image-displaying side. The externally bendable region 42 is a region in which the display module is bent towards a side having a support plate. Whether the internally bendable region 41 or the externally bendable region 42 can be specifically formed in the bendable region depends on a bending direction of the device body 10 and structural design of a technical person. Therefore, distribution of the internally bendable region 41 and the externally bendable region 42 may be different in different foldable-screen devices. This is not limited in this embodiment of this application.

Figure 4:
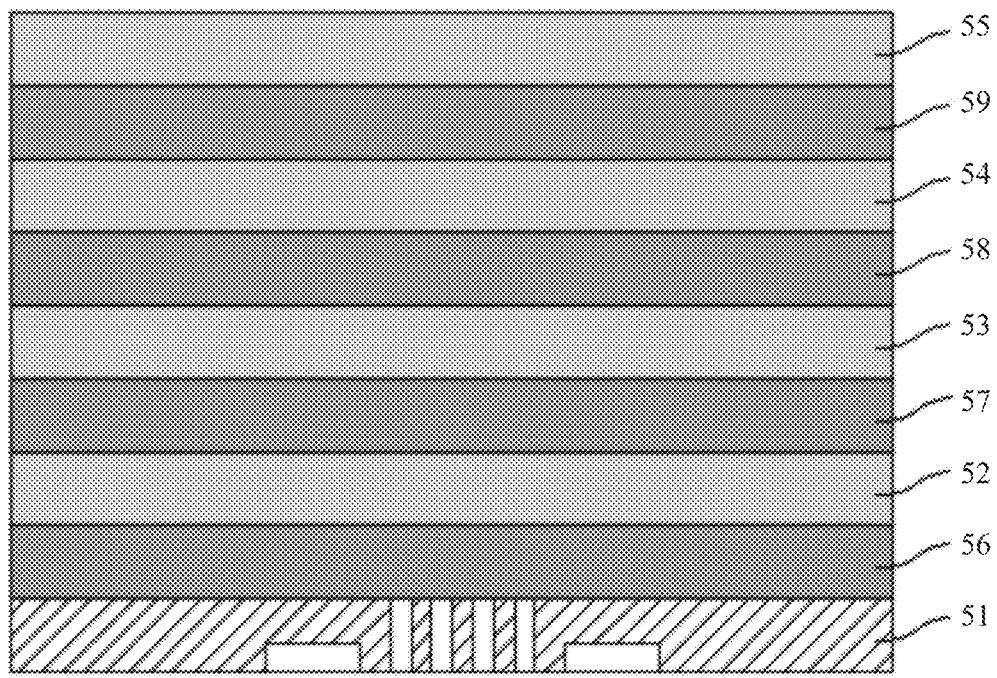
FIG. 4 is a schematic diagram of a structure of a display module of an existing foldable-screen device.

FIG. 4 is a schematic diagram of a structure of a display module of an existing foldable-screen device. As shown in FIG. 4, the display module of the foldable-screen device has a multi-layer stacked structure. The multi-layer stacked structure may include a support plate 51, a substrate 52, a display panel 53, a first protection layer 54, and a second protection layer 55 sequentially from the bottom up. For example, the support plate 51 may be a TA4 titanium alloy plate; the substrate 52 may be a polyimide PI substrate; the display panel 53 may be a flexible organic light-emitting diode (OLED); the first protection layer 54 may be a polarizing layer (Polarizer); and the second protection layer 55 may be a cover plate. Further, a pressure-sensitive adhesive 56 is disposed between the support plate 51 and the substrate 52, and the support plate 51 and the substrate 52 are attached together by using the pressure-sensitive adhesive 56; a pressure-sensitive adhesive 57 is disposed between the substrate 52 and the display panel 53, and the substrate 52 and the display panel 53 are attached together by using the pressure-sensitive adhesive 57; an optically clear adhesive 58 is disposed between the display panel 53 and the first protection layer 54, and the display panel 53 and the first protection layer 54 are attached together by using the optically clear adhesive 58; and an optically clear adhesive 59 is disposed between the first protection layer 54 and the second protection layer 55, and the first protection layer 54 and the second protection layer 55 are attached together by using the optically clear adhesive 59. Generally, in actual production, a structure formed by the support plate 51/pressure-sensitive adhesive 56/substrate 52/pressure-sensitive adhesive 57 usually exists as an independent assembly. For ease of description, this assembly is referred to as a support assembly in this application.

Further, as shown in FIG. 4, hollowing out is performed on a bendable region of the support plate 51 of the display module, to reduce an internal stress generated during bending of the display module. Hollowing out the support plate 51 can reduce, to some extent, the internal stress generated during the bending of the display module. However, actual tests show that the internal stress generated during the bending of the display module is still very large. An internal stress exerted on the optically clear adhesive 58 between the display panel 53 and the first protection layer 54 is the largest. As a result, the optically clear adhesive 58 is prone to peel from the display panel 53 and the first protection layer 54 that are in an attached state, that is, peeling occurs, making the display module imprinted or damaged.

A first embodiment of this application is described below.

Figure 5:
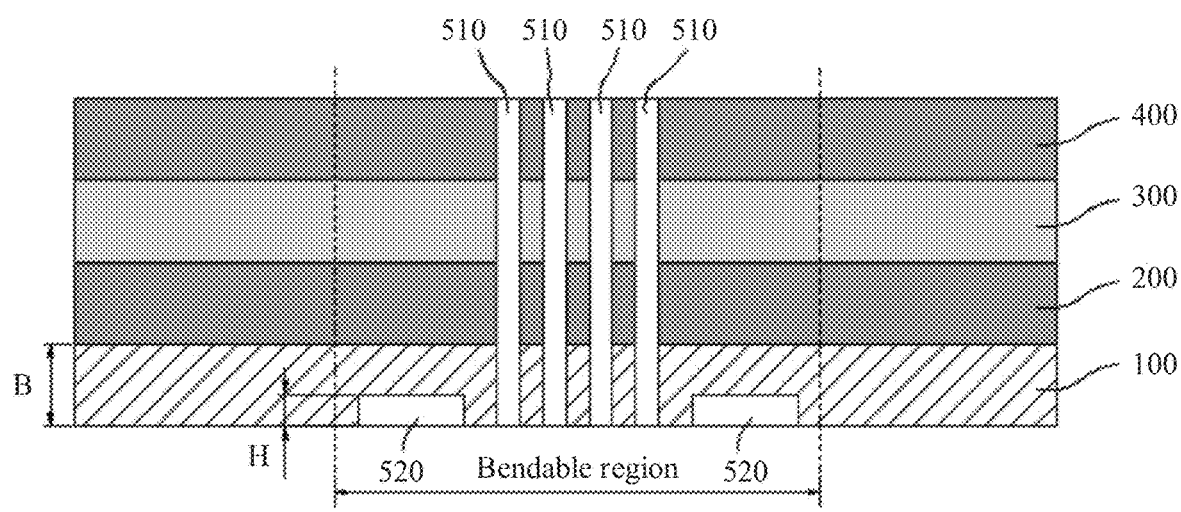
FIG. 5 is a schematic diagram of a structure of a support assembly according to a first embodiment of this application.

The first embodiment of this application provides a support assembly. The support assembly can further reduce the internal stress generated during the bending of the display module, to avoid peeling. FIG. 5 is a schematic diagram of a structure of the support assembly according to the first embodiment of this application. As shown in FIG. 5, the support assembly includes a support plate 100, a first adhesive layer 200, a substrate 300, and a second adhesive layer 400. The support plate 100, the first adhesive layer 200, the substrate 300, and the second adhesive layer 400 are stacked from the bottom up. Specifically:

The support plate 100 may be used as the bottommost layer of the support assembly, is generally made of a high-modulus plate, for example, TA4 titanium alloy, stainless steel, or polyvinyl alcohol (PVA) high-modulus fiber, and may alternatively be made of a material having specific plasticity and rigidity. The support plate 100 is configured to support the display module and maintain a form of the display module when a device body of a foldable-screen device is in various folded/unfolded states.

The first adhesive layer 200 is disposed on the support plate 100. For example, the first adhesive layer 200 may be an adhesive layer formed by a pressure-sensitive adhesive, or may be an adhesive layer formed by an optically clear adhesive.

The substrate 300 is disposed on the first adhesive layer 200. The substrate 300 is attached to the support plate 100 by using the first adhesive layer 200. For example, the substrate 300 may be a polyethylene terephthalate PET film, a polyimide PI substrate, or the like. The substrate 300 is used as a connection structure between the support assembly and another structure of the display module. A surface, facing the support plate 100, of the substrate 300 is attached to the support plate 100 by using the first adhesive layer 200. A surface, back to the support plate 100, of the substrate 300 is configured to attach to another structure (for example, a display panel) of the display module.

The second adhesive layer 400 is disposed on the substrate 300. For example, the second adhesive layer 400 may be an adhesive layer formed by a pressure-sensitive adhesive, or may be an adhesive layer formed by an optically clear adhesive. The support assembly is configured to attach to another structure of the display module by using the second adhesive layer 400, thereby forming a complete display module of the foldable-screen device.

In this embodiment of this application, the first adhesive layer 200 is disposed on the surface, facing the support plate 100, of the substrate 300; and the second adhesive layer 400 is disposed on the surface, back to the support plate 100, of the substrate 300. Therefore, the first adhesive layer 200, the substrate 300, and the second adhesive layer 400 actually form a double-sided adhesive structure. It may be considered that the support plate 100 and the another structure of the display module are attached together by using a double-sided adhesive.

Specific implementations may be as follows: The first adhesive layer 200 and the second adhesive layer 400 are first coated or adhered to two sides of the substrate 300, to form the double-sided adhesive; and then, the double-sided adhesive is attached to the support plate 100. Alternatively, the first adhesive layer 200 is first coated or adhered to the support plate 100; then, the substrate 300 is attached to the first adhesive layer 200; and finally, the second adhesive layer 400 is coated or adhered to the surface, back to the support plate 100, of the substrate 300.

Further, as shown in FIG. 5, the support assembly in this embodiment of this application is further provided with a hollowed-out structure. For example, the hollowed-out structure may be provided in a bendable region of the support assembly. The hollowed-out structure may include at least a plurality of first holes 510. The plurality of first holes 510 are distributed in the bendable region of the support assembly at intervals in an array.

In this embodiment of this application, the first holes 510 may be through holes that are formed in the support plate 100, the first adhesive layer 200, the substrate 300, and the second adhesive layer 400, and penetrate through the support plate 100, the first adhesive layer 200, the substrate 300, and the second adhesive layer 400 sequentially in a stacking direction of the support plate 100, the first adhesive layer 200, the substrate 300, and the second adhesive layer 400 (may be a direction perpendicular to the support plate 100), thereby penetrating through the entire support assembly. In this way, in the bendable region of the support assembly, material removal is performed on all of the support plate 100, the first adhesive layer 200, the substrate 300, and the second adhesive layer 400 of the support assembly by forming the first holes 510, so that internal stresses of the support plate 100, the first adhesive layer 200, the substrate 300, and the second adhesive layer 400 generated during bending are reduced.

Further, when the bendable region of the support assembly includes an externally bendable region and an internally bendable region, the support assembly is generally bent in the internally bendable region by a smaller radius, leading to a larger bending degree. Therefore, the plurality of first holes 510 are preferentially distributed in the internally bendable region of the support assembly, to reduce internal stresses of portions, in the internally bendable region, of the support assembly and the display module.

Further, as shown in FIG. 5, in an implementation, the hollowed-out structure further includes at least one second hole 520. When the bendable region of the support assembly includes an externally bendable region and an internally bendable region, the at least one second hole 520 may be formed in the externally bendable region of the support assembly. When there are a plurality of second holes 520 in the externally bendable region, the plurality of second holes 520 are distributed at intervals in an array.

In a specific implementation, the second hole 520 may be a blind hole that is formed in a plate surface, back to the substrate 300, of the support plate 100 and form a specific depth H in a direction of the substrate 300. The depth H of the second hole 520 is less than a thickness B of the support plate 100. In this case, when the support assembly is bent, the support plate 100 may have a larger deformation space in the externally bendable region. Therefore, an internal stress generated in the externally bendable region by the support plate 100 is smaller. This facilitates reducing an entire stress on portions, in the externally bendable region, of the support assembly and the display module. In addition, a plate surface, facing the substrate 300, of the support plate 100 can still maintain a continuous structure in the externally bendable region. This also ensures structural strength of the externally bendable region.

In this embodiment of this application, the hollowed-out structure may be obtained by using a laser cutting process or an etching process in the support assembly.

For example, the hollowed-out structure may be manufactured after the support plate 100, the first adhesive layer 200, the substrate 300, and the second adhesive layer 400 are attached to form an integral structure. For example, after the support plate 100, the first adhesive layer 200, the substrate 300, and the second adhesive layer 400 are attached to form the integral structure, materials at locations at which the first holes 510 need to be formed are removed by using the laser cutting process with a cutting depth that is formed in one step and that penetrates through the support plate 100, the first adhesive layer 200, the substrate 300, and the second adhesive layer 400, thereby obtaining the first holes 510.

For example, the hollowed-out structure may be manufactured before the support plate 100, the first adhesive layer 200, the substrate 300, and the second adhesive layer 400 are attached to form an integral structure. For example, before the support plate 100 is attached to the first adhesive layer 200, the substrate 300, and the second adhesive layer 400, materials at locations at which the first holes 510 (and the second hole 520) need to be formed in the support plate 100 may be removed by using the laser cutting process, thereby obtaining portions that are of the first holes 510 (and the second hole 520) and that are in the support plate 100. In addition, materials at locations at which the first holes 510 need to be formed in the double-sided adhesive formed by the first adhesive layer 200, the substrate 300, and the second adhesive layer 400 may be removed by using the laser cutting process, to obtain portions that are of the first holes 510 and that are in double-sided adhesive. Finally, the support plate 100 that is provided with the first holes 510 (and the second hole 520) and the double-sided adhesive that is provided with the first holes 510 are attached to form the support assembly having the hollowed-out structure.

In this embodiment of this application, the hollowed-out structure may be obtained by performing cutting based on a specific pattern.

Figure 6:
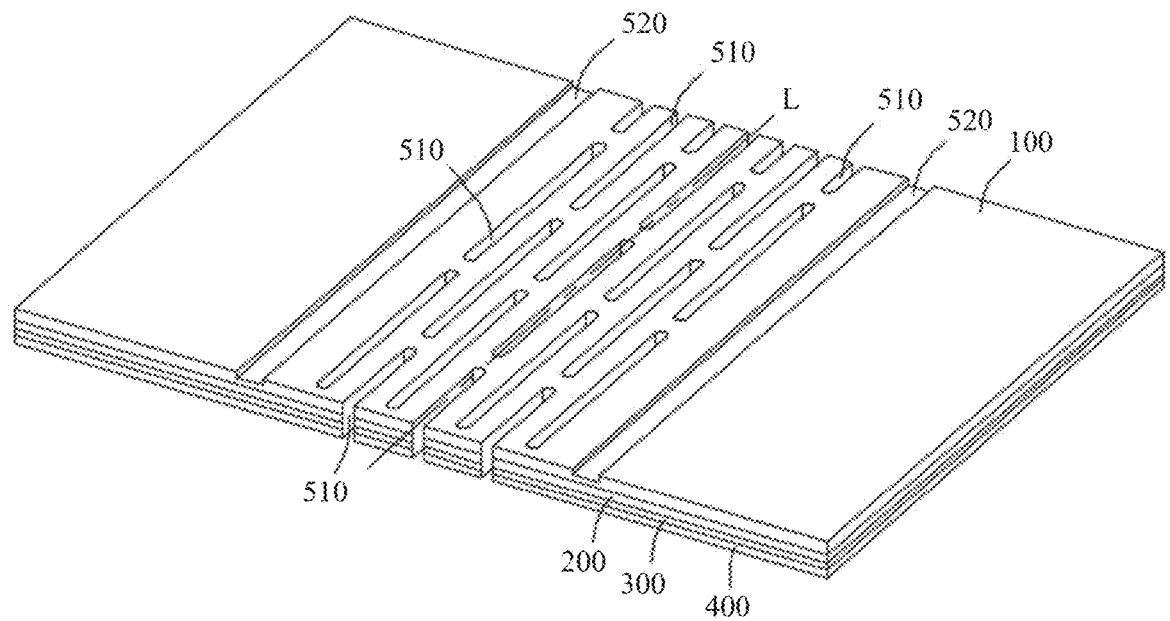
FIG. 6 is a schematic diagram of a pattern of a hollowed-out structure according to an embodiment of this application.

FIG. 6 is a schematic diagram of a pattern of a hollowed-out structure according to an embodiment of this application. Based on a pattern shown in FIG. 6, in an implementation, the first hole 510 may be, for example, a strip-shaped hole; a length direction of the first hole 510 is parallel to an axis L of the bendable region of the support assembly; and the plurality of first holes 510 are distributed at intervals in the array in directions parallel to the axis L and directions perpendicular to the axis L. In the directions parallel to the axis L and the directions perpendicular to the axis L, there is a specific interval between every two adjacent first holes 510. In addition, in the directions parallel to the axis L, the plurality of first holes 510 are distributed from one end of the support plate 100 to the other end of the support plate 100, so that any location of the support assembly in the directions parallel to the axis L has good bending performance. In addition, in the directions perpendicular to the axis L, the plurality of first holes 510 are distributed in a specific width range.

Further, as shown in FIG. 6, in an implementation, the second hole 520 may be, for example, a strip-shaped hole; a length direction of the second hole 520 is parallel to an axis L of the bendable region of the support assembly; the plurality of second holes 520 are distributed at intervals in the array in a direction perpendicular to the axis L; and there is a specific interval between every two adjacent second holes 520. Preferentially, a length of the second hole 520 is equal to a width that is of the support plate 100 and that is in a direction parallel to the axis L. In this way, the second hole 520 continuously extends in the direction parallel to the axis L from an end surface on one side of the support plate 100 to an end surface on the other side of the support plate 100, thereby penetrating through the support plate 100 in the direction parallel to the axis L.

It can be learned that according to the support assembly provided in the first embodiment of this application, internal stresses of structures on layers of the support assembly are reduced due to a structure of the first holes, so that a stress exerted by the support assembly on another structure of the display module (for example, a stress exerted on an optically clear adhesive) is further reduced. Therefore, an attached state of the structures on the layers of the display module is prevented from being damaged by an excessive stress; no peeling phenomenon occurs after the display module is bent; and reliability of the display module is improved.

A second embodiment of this application is described below.

Figure 7:
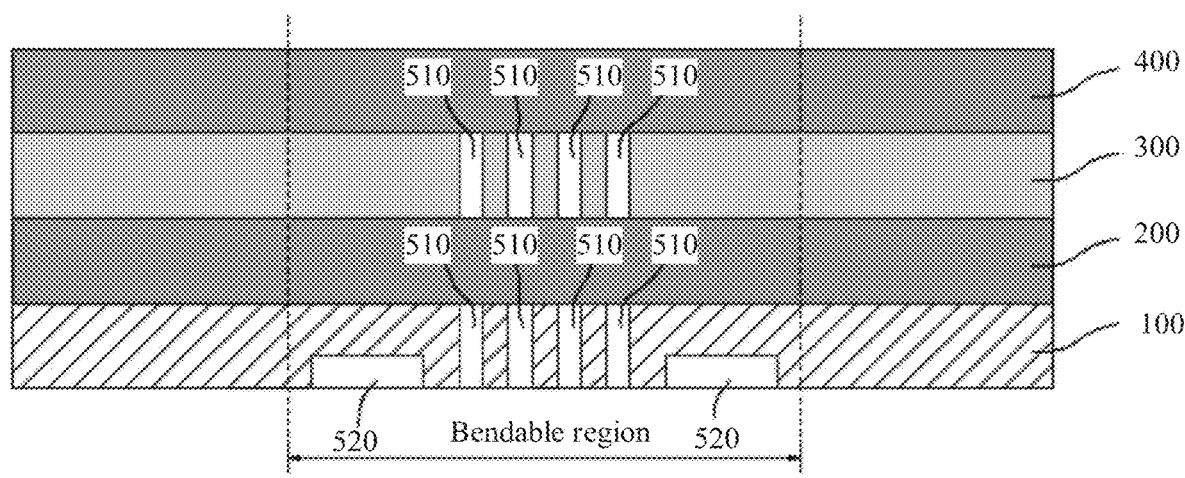
FIG. 7 is a schematic diagram of a structure of a support assembly according to a second embodiment of this application.

The second embodiment of this application provides a support assembly. The support assembly can further reduce the internal stress generated during the bending of the display module, to avoid peeling. FIG. 7 is a schematic diagram of a structure of the support assembly according to the second embodiment of this application. As shown in FIG. 7, the support assembly includes a support plate 100, a first adhesive layer 200, a substrate 300, and a second adhesive layer 400. The support plate 100, the first adhesive layer 200, the substrate 300, and the second adhesive layer 400 are stacked from the bottom up.

The support assembly in the second embodiment of this application differs from the support assembly in the first embodiment of this application in that:

A plurality of first holes 510 are formed in only the support plate 100 and the substrate 300, and the first adhesive layer 200 and the second adhesive layer 400 are provided with no first hole 510. On the support plate 100, the first holes 510 extend from a plate surface, back to the substrate 300, of the support plate 100 to a plate surface, facing the substrate 300, of the support plate 100, thereby penetrating through the support plate 100. On the substrate 300, the first holes 510 extend from a surface, facing the support plate 100, of the substrate 300 to a surface, back to the support plate 100, of the substrate 300, thereby penetrating through the substrate 300. Being provided with no first hole 510, the first adhesive layer 200 is coated entirely between the support plate 100 and the substrate 300. Being provided with no first hole 510, the second adhesive layer 400 is coated entirely on the surface, back to the support plate 100, of the substrate 300.

In this embodiment of this application, material removal is performed on the support plate 100 and the substrate 300 of the support assembly by forming the first holes 510, so that during bending of the support assembly, the support plate 100 and the substrate 300 can obtain larger deformation spaces. This facilitates release of internal stresses, and reduces internal stresses of structures on layers of the support assembly.

In this embodiment of this application, the first holes 510 may be formed in the support plate 100 and the substrate 300 by using a laser cutting process or an etching process.

For example, the first holes 510 may be formed before the support plate 100 is attached to the substrate 300. For example, before the support plate 100 is attached to the substrate 300, materials at locations at which first holes 510 need to be formed in the support plate 100 may be removed by using the laser cutting process, thereby obtaining portions that are of the first holes 510 and that are in the support plate 100. In addition, before an adhesive layer is coated on the substrate 300, materials at locations at which the first holes 510 need to be formed in the substrate 300 may be removed by using the laser cutting process, thereby obtaining portions that are of the first holes 510 and that are in the substrate 300. Then, the first adhesive layer 200 is coated or adhered to the substrate 300 that is provided with the first holes 510. Finally, the support plate 100 that is provided with the first holes 510 and the substrate 300 that is provided with the first holes 510 are attached by using the first adhesive layer 200, to form an integral structure.

For example, the first holes 510 may be formed after the support plate 100 is attached to the substrate 300. For example, the first adhesive layer 200 may be first coated or adhered to the substrate 300, so that the support plate 100 and the substrate 300 are attached by using the first adhesive layer 200 to form an integral structure. Then, the laser cutting process or the etching process is performed on the integral structure that is formed after the support plate 100 and the substrate 300 are attached, to remove materials at locations at which the first holes 510 need to be formed in the support plate 100 and the substrate 300, thereby obtaining the first holes 510 in the support plate 100 and the first holes 510 in the substrate 300.

For other features that are not described in detail in the second embodiment of this application, reference may be made to the first embodiment of this application. Details are not described herein again.

It can be learned that according to the support assembly in the second embodiment of this application, the internal stresses of the structures on the layers of the support assembly are reduced due to a structure of the first holes, so that a stress exerted by the support assembly on another stacked structure of the display module is further reduced. Therefore, a status of attaching between the structures on the layers of the display module is prevented from being damaged by an excessive stress; no peeling phenomenon occurs after the display module is bent; and reliability of the display module is improved.

A third embodiment of this application is described below.

The third embodiment of this application provides a display module. Compared with a conventional bendable display module, the display module in the third embodiment of this application has a smaller internal stress during bending, so that peeling can be avoided.

Figure 8:
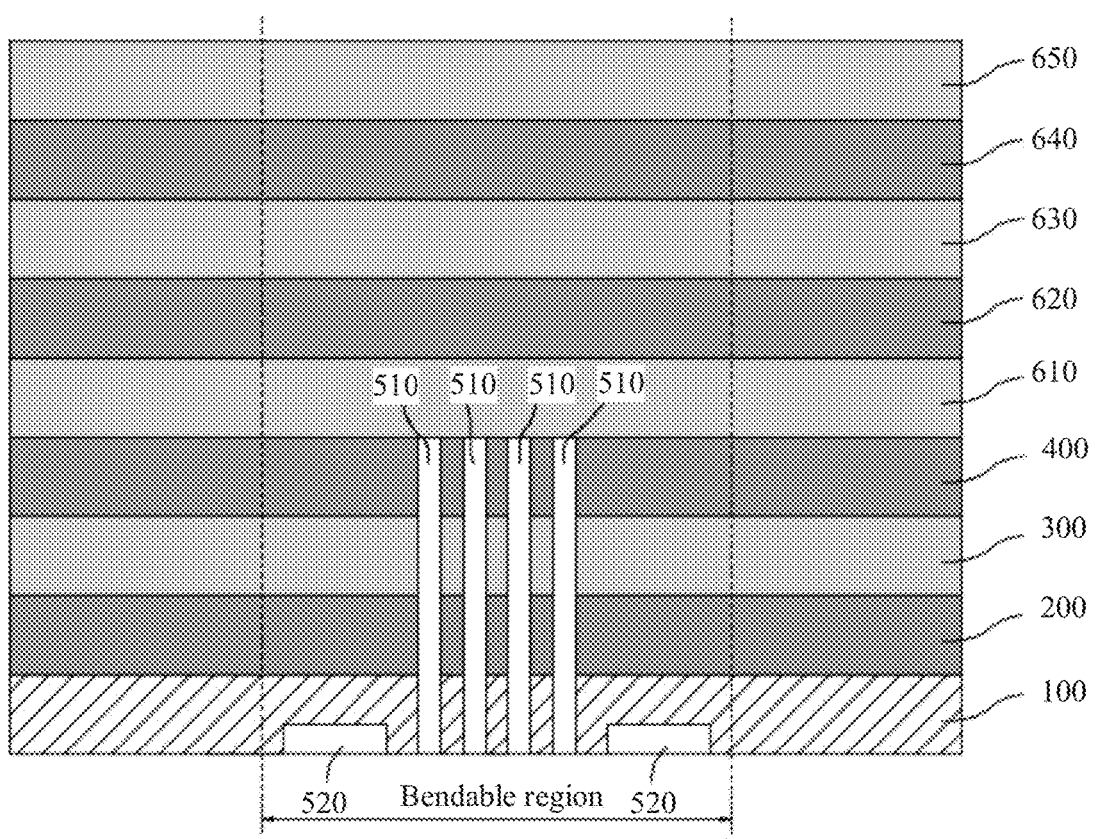
FIG. 8 is a schematic diagram of a structure of a display module according to a third embodiment of this application.

FIG. 8 is a schematic diagram of a structure of the display module according to the third embodiment of this application. As shown in FIG. 8, the display module includes: the support assembly according to the first embodiment of this application and each implementation of the first embodiment, a display panel 610, a third adhesive layer 620, a first protection layer 630, a fourth adhesive layer 640, and a second protection layer 650. The support assembly, the display panel 610, the third adhesive layer 620, the first protection layer 630, the fourth adhesive layer 640, and the second protection layer 650 are stacked from the bottom up. Specifically:

The support assembly may be used as the bottommost layer of the display module. As shown in FIG. 5, the support assembly may include: a support plate 100; a first adhesive layer 200 disposed on the support plate 100; a substrate 300 disposed on the first adhesive layer 200, where the substrate 300 is attached to the support plate 100 by using the first adhesive layer 200; a second adhesive layer 400 disposed on the substrate 300; and first holes 510 penetrating through the support plate 100, the first adhesive layer 200, the substrate 300, and the second adhesive layer 400, and/or second holes 520 formed in the support plate 100.

The display panel 610 is disposed on the second adhesive layer 400. The display panel 610 is attached to the substrate 300 by using the second adhesive layer 400. The display panel 610 is configured to display an image. For example, the display panel 610 may be a flexible organic light-emitting diode (OLED) display panel or another flexible display panel such as a flexible micro-LED display panel or a mini-LED display panel.

The third adhesive layer 620 is disposed on the display panel 610. For example, the third adhesive layer 620 may be an adhesive layer formed by an optically clear adhesive, or may be an adhesive layer formed by a pressure-sensitive adhesive.

The first protection layer 630 is disposed on the third adhesive layer 620. The first protection layer 630 is attached to the display panel 610 by using the third adhesive layer 620. For example, the first protection layer 630 may be a polarizing layer (Polarizer).

The fourth adhesive layer 640 is disposed on the first protection layer 630. For example, the fourth adhesive layer 640 may be an adhesive layer formed by an optically clear adhesive, or may be an adhesive layer formed by a pressure-sensitive adhesive.

The second protection layer 650 is disposed on the fourth adhesive layer 640. The second protection layer 650 is used as a cover plate of the display module, and may be made of a material such as ultra-thin glass or a clear polyimide film, thereby having good bending performance.

Figure 9:
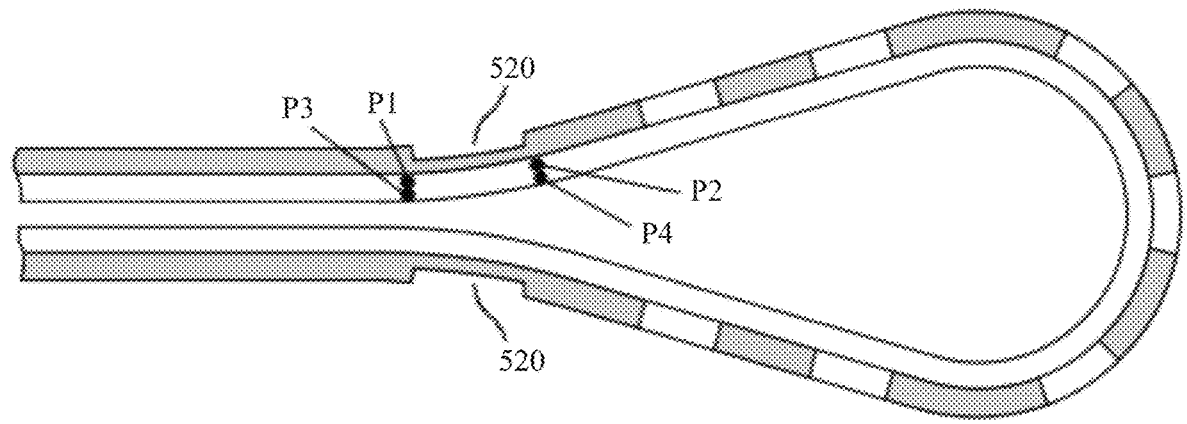
FIG. 9 is a schematic diagram of a simulated bending test of a display module according to an embodiment of this application.

FIG. 9 is a schematic diagram of a simulated bending test of a display module according to an embodiment of this application. As shown in FIG. 9, the following may be performed to verify that the display module in this embodiment of this application has a capability of reducing an internal stress generated during bending: Simulating bending of the display module in a case that a device body of an internally foldable-screen device is in a folded state; and selecting some sampling points for internal stress sampling. Because a third adhesive layer usually bears the largest internal stress, two sampling points are selected from the third adhesive layer in this embodiment of this application, which are P1 at an external rounded corner in a region of a second hole 520 and P2 at an internal rounded corner in the region of the second hole 520. In addition, two sampling points are also selected from the fourth adhesive layer in this embodiment of this application, which are P3 at an external rounded corner in the region of the second hole 520 and P4 at an internal rounded corner in the region of the second hole 520. Sampling results are shown in Table 1.

TABLE 1

| Solution | External rounded corner in a region of a second hole | | Internal rounded corner in the region of the second hole | |
| --- | --- | --- | --- | --- |
| | Fourth adhesive layer | Third adhesive layer | Fourth adhesive layer | Third adhesive layer |
| Conventional display module | — | — | — | — |
| Display module in the third embodiment of this application | Proportion by which an internal stress is reduced than that of the conventional display module | | | |
| | ~8% | ~15% | ~12% | ~15% |

It can be learned from Table 1 that, at the external rounded corner in the region of the second hole, an internal stress born by the third adhesive layer is reduced by 15% than that of the conventional display module solution, and an internal stress born by the fourth adhesive layer is reduced by 8% than that of the conventional display module solution; and at the internal rounded corner in the region of the second hole, an internal stress born by the third adhesive layer is reduced by 15% than that of the conventional display module solution, and an internal stress born by the fourth adhesive layer is reduced by 12% than that of the conventional display module solution.

It can be learned that the display module in the third embodiment of this application has a smaller stress during bending. Therefore, a status of attaching between structures on layers of the display module is prevented from being damaged by the internal stress; no peeling phenomenon occurs after the display module is bent; and reliability of the display module is improved.

A fourth embodiment of this application is described below.

The fourth embodiment of this application provides a display module. Compared with a conventional bendable display module, the display module in the fourth embodiment of this application has a smaller internal stress during bending, so that peeling can be avoided.

Figure 10:
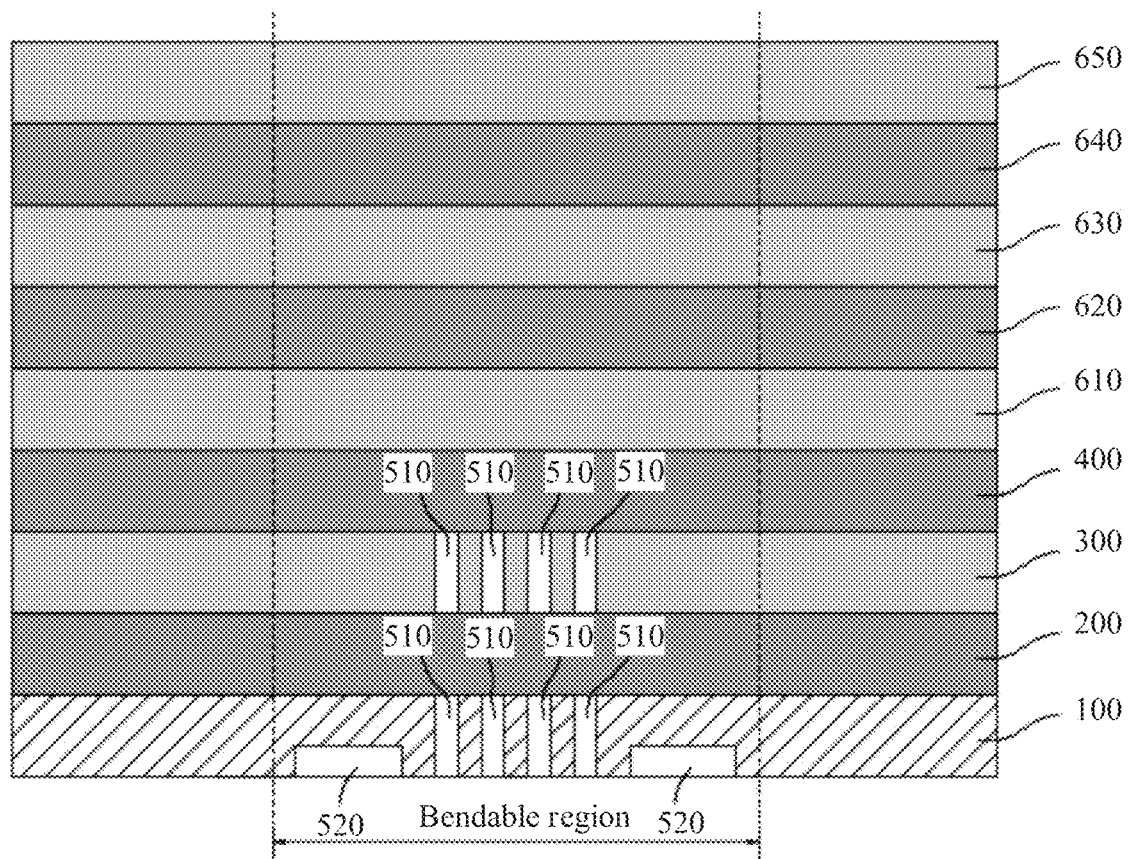
FIG. 10 is a schematic diagram of a structure of a display module according to a fourth embodiment of this application.

FIG. 10 is a schematic diagram of a structure of the display module according to the fourth embodiment of this application. As shown in FIG. 10, the display module includes: the support assembly according to the second embodiment of this application and each implementation of the second embodiment, a display panel 610, a third adhesive layer 620, a first protection layer 630, a fourth adhesive layer 640, and a second protection layer 650. The support assembly, the display panel 610, the third adhesive layer 620, the first protection layer 630, the fourth adhesive layer 640, and the second protection layer 650 are stacked from the bottom up. Specifically:

The support assembly may be used as the bottommost layer of the display module. As shown in FIG. 7, the support assembly may include: a support plate 100; a first adhesive layer 200 disposed on the support plate 100; a substrate 300 disposed on the first adhesive layer 200, where the substrate 300 is attached to the support plate 100 by using the first adhesive layer 200; a second adhesive layer 400 disposed on the substrate 300; and first holes 510 penetrating through the support plate 100 and the substrate 300, and/or second holes 520 formed in the support plate 100.

The display panel 610 is disposed on the second adhesive layer 400. The display panel 610 is attached to the substrate 300 by using the second adhesive layer 400. The display panel 610 is configured to display an image. For example, the display panel 610 may be a flexible organic light-emitting diode OLED display panel or another flexible display panel such as a flexible micro-LED display panel or a mini-LED display panel.

The third adhesive layer 620 is disposed on the display panel 610. For example, the third adhesive layer 620 may be an adhesive layer formed by an optically clear adhesive, or may be an adhesive layer formed by a pressure-sensitive adhesive.

The first protection layer 630 is disposed on the third adhesive layer 620. The first protection layer 630 is attached to the display panel 610 by using the third adhesive layer 620. For example, the first protection layer 630 may be a polarizing layer.

The fourth adhesive layer 640 is disposed on the first protection layer 630. For example, the fourth adhesive layer 640 may be an adhesive layer formed by an optically clear adhesive, or may be an adhesive layer formed by a pressure-sensitive adhesive.

The second protection layer 650 is disposed on the fourth adhesive layer 640. The second protection layer 650 is used as a cover plate of the display module, and may be made of a material such as ultra-thin glass or a clear polyimide film, thereby having good bending performance.

Table 2 shows results of simulated bending tests and sampling performed on the display module in the fourth embodiment of this application in a manner of a simulated bending test and sampling that are shown in FIG. 9.

It can be learned that the display module in the fourth embodiment of this application has a smaller stress during bending. Therefore, a status of attaching between structures on layers of the display module is prevented from being damaged by the internal stress; no peeling phenomenon occurs after the display module is bent; and reliability of the display module is improved.

An embodiment of this application further provides an electronic device. For example, the electronic device may be a foldable-screen device, a rollable-screen device, or any electronic device with a bendable display screen. The electronic device may include one or more display modules, where at least one of the display modules is the display module according to the third embodiment or the fourth embodiment of this application, or at least one of the display modules includes the support assembly according to the first embodiment or the second embodiment of this application or any implementation of the first embodiment or the second embodiment. For example, the electronic device may be an internally foldable-screen device. The internally foldable-screen device may include an internal screen module and an external screen module. The internal screen module is a display module that is hidden when a device body is in a folded state. The external screen module is a display module that is always exposed regardless of the device body's state. The internal screen module is the display module in the third embodiment or the fourth embodiment of this application.

It is easy to understand that a person skilled in the art may combine, split, and recombine the embodiments of this application on the basis of several embodiments provided in this application to obtain other embodiments, and all of the embodiments fall within the protection scope of this application.

The objectives, technical solutions, and benefits of this application are further described in detail in the foregoing specific implementations. It should be understood that the foregoing descriptions are merely specific implementations of this application, but are not intended to limit the protection scope of this application. Any modification, equivalent replacement or improvement made based on the technical solutions in this application shall fall within the protection scope of this application.

TABLE 2

| Solution | External rounded corner in a region of a second hole | | Internal rounded corner in the region of the second hole | |
|---|---|---|---|---|
| | Fourth adhesive layer | Third adhesive layer | Fourth adhesive layer | Third adhesive layer |
| Conventional display module | — | — | — | — |
| Display module in the fourth embodiment of this application | Proportion by which an internal stress is reduced than that of the conventional display module | | | |
| | ~8% | ~15% | ~9% | ~12% |

It can be learned from Table 2 that, at the external rounded corner in the region of the second hole, an internal stress born by the third adhesive layer is reduced by 15% than that of the conventional display module solution, and an internal stress born by the fourth adhesive layer is reduced by 8% than that of the conventional display module solution; and at the internal rounded corner in the region of the second hole, an internal stress born by the third adhesive layer is reduced by 12% than that of the conventional display module solution, and an internal stress born by the fourth adhesive layer is reduced by 9% than that of the conventional display module solution.

What is claimed is:

1. A support assembly, comprising:
   a support plate, a first adhesive layer, a substrate, and a second adhesive layer, wherein the support plate, the first adhesive layer, the substrate, and the second adhesive layer are stacked in a stacking direction from a bottom up;
   wherein the substrate is attached to the support plate by using the first adhesive layer, and the support assembly is configured to attach to another structure by using the second adhesive layer, thereby forming a display component of a foldable-screen device;

wherein the support assembly comprises a bendable region, the support assembly is configured to bend in the bendable region, the support assembly is provided with a plurality of first holes in an internally bendable region in the bendable region, the plurality of first holes are distributed at intervals in a first array, and the plurality of first holes penetrate through the support plate in the stacking direction;

wherein the support assembly is provided with a plurality of second holes in an externally bendable region in the bendable region, the plurality of second holes are distributed at intervals in a second array and formed in a first surface of the support plate opposite to a second surface of the support plate in contact with the first adhesive layer, wherein holes in the plurality of second holes have depth H in the stacking direction, wherein the depth H is less than a thickness B of the support plate in the stacking direction; and wherein the support assembly is configured to bend, from an unfolded state towards a folded state, in the internally bendable region towards the second adhesive layer, and wherein the support assembly is configured to bend, from the unfolded state towards the folded state, in the externally bendable region towards the support plate.

2. The support assembly according to claim 1, wherein the plurality of first holes penetrate through the support plate, the first adhesive layer, the substrate, and the second adhesive layer in the stacking direction.

3. The support assembly according to claim 1, wherein the plurality of first holes are formed in the support plate and the substrate, and penetrate through the support plate and the substrate in the stacking direction.

4. The support assembly according to claim 1, wherein:
each first hole in the plurality of first holes is a strip-shaped hole, and a length direction of the first hole is parallel to an axis of the bendable region of the support assembly; and
the plurality of first holes are distributed at intervals in the first array in directions parallel to the axis and directions perpendicular to the axis.

5. The support assembly according to claim 1, wherein:
each second hole in the plurality of second holes is a strip-shaped hole, and a length direction of the second hole is parallel to the axis;
each second hole in the plurality of second holes continuously extends in a direction parallel to the axis from an end surface on one side of the support plate to an end surface on the other side of the support plate; and
the plurality of second holes are distributed at intervals in the second array in a direction perpendicular to the axis.

6. The support assembly according to claim 1, wherein both the first adhesive layer and the second adhesive layer comprise pressure-sensitive adhesives.

7. A display component, comprising:
the support assembly according to claim 1, a display panel, a third adhesive layer, a first protection layer, a fourth adhesive layer, and a second protection layer;
wherein the support assembly, the display panel, the third adhesive layer, the first protection layer, the fourth adhesive layer, and the second protection layer are stacked from the bottom up; and
wherein the display panel is attached to the substrate of the support assembly by using the second adhesive layer, the first protection layer is attached to the display panel by using the third adhesive layer, and the second protection layer is attached to the first protection layer by using the fourth adhesive layer.

8. The display component according to claim 7, wherein the display panel is an organic light-emitting diode (OLED) display panel.

9. The display component according to claim 7, wherein both the third adhesive layer and the fourth adhesive layer comprise optically clear adhesives.

10. The support assembly according to claim 1, wherein the plurality of first holes penetrate through the substrate in the stacking direction.

11. A support assembly, comprising:
a support plate, a first adhesive layer, a substrate, and a second adhesive layer, wherein the support plate, the first adhesive layer, the substrate, and the second adhesive layer are stacked in a stacking direction from a bottom up;
wherein the substrate is attached to the support plate by using the first adhesive layer, and the support assembly is configured to attach to another structure by using the second adhesive layer, thereby forming a display component of a foldable-screen device;
wherein the support assembly comprises a bendable region, the support assembly is configured to bend in the bendable region, the support assembly is provided with a plurality of first holes in an internally bendable region in the bendable region, the plurality of first holes are distributed at intervals in a first array, and the plurality of first holes are formed in the support plate and penetrate through the support plate in the stacking direction;
wherein the support assembly is provided with a plurality of second holes in an externally bendable region in the bendable region, the plurality of second holes are distributed at intervals in a second array and formed in a first surface of the support plate opposite to a second surface of the support plate in contact with the first adhesive layer, wherein holes in the plurality of second holes have depth H in the stacking direction, wherein the depth H is less than a thickness B of the support plate in the stacking direction; and
wherein the support assembly is configured to bend, from an unfolded state towards a folded state, in the internally bendable region towards the second adhesive layer, and wherein the support assembly is configured to bend, from the unfolded state towards the folded state, in the externally bendable region towards the support plate.

12. The support assembly according to claim 11, wherein the plurality of first holes penetrate through the support plate, the first adhesive layer, the substrate, and the second adhesive layer in the stacking direction.

13. The support assembly according to claim 11, wherein:
each first hole in the plurality of first holes is a strip-shaped hole, and a length direction of the first hole is parallel to an axis of the bendable region of the support assembly; and
the plurality of first holes are distributed at intervals in the first array in directions parallel to the axis and directions perpendicular to the axis.

14. The support assembly according to claim 11, wherein:
each second hole in the plurality of second holes is a strip-shaped hole, and a length direction of the second hole is parallel to the axis;
each second hole in the plurality of second holes continuously extends in a direction parallel to the axis from an end surface on one side of the support plate to an end surface on the other side of the support plate; and the plurality of second holes are distributed at intervals in the second array in a direction perpendicular to the axis.

15. The support assembly according to claim 11, wherein both the first adhesive layer and the second adhesive layer comprise pressure-sensitive adhesives.

16. The support assembly according to claim 11, wherein the plurality of first holes are further formed in the substrate and penetrate through the substrate in the stacking direction.

* * * * *